US009424952B1

(12) United States Patent
Seok et al.

(10) Patent No.: US 9,424,952 B1
(45) Date of Patent: Aug. 23, 2016

(54) CIRCUITS, METHODS, AND MEDIA FOR DETECTING AND COUNTERING AGING DEGRADATION IN MEMORY CELLS

(71) Applicants: Mingoo Seok, New York, NY (US); Peter Kinget, Summit, NJ (US); Teng Yang, New York, NY (US)

(72) Inventors: Mingoo Seok, New York, NY (US); Peter Kinget, Summit, NJ (US); Teng Yang, New York, NY (US)

(73) Assignee: The Trustees of Columbia University in the City of New York, New York, NY (US)

( * ) Notice: Subject to any disclaimer, the term of this patent is extended or adjusted under 35 U.S.C. 154(b) by 0 days.

(21) Appl. No.: 15/018,834

(22) Filed: Feb. 8, 2016

Related U.S. Application Data

(60) Provisional application No. 62/113,392, filed on Feb. 7, 2015.

(51) Int. Cl.
*G11C 29/50* (2006.01)
*G11C 11/417* (2006.01)

(52) U.S. Cl.
CPC ....... *G11C 29/50004* (2013.01); *G11C 11/417* (2013.01); *G11C 29/50012* (2013.01); *G11C 29/50016* (2013.01)

(58) Field of Classification Search
CPC .......... G11C 11/417; G11C 29/50004; G11C 29/50012; G11C 29/50016
See application file for complete search history.

(56) References Cited

U.S. PATENT DOCUMENTS 7,936,623 B2 * 5/2011 Deng .................... G11C 11/412
365/154

OTHER PUBLICATIONS

Kumar et al., "Impact of NBTI on SRAM Read Stability and Design for Reliability," 7th International Symposium on Quality Electronic Design (ISQED'06), Mar. 27-29, 2006, pp. 210-218.*
Seok et al., "A Portable 2-Transistor Picowatt Temperature-Compensated Voltage Reference Operating at 0.5 V," IEEE Journal of Solid-State Circuits. vol. 47, No. 10, Oct. 3, 2012, pp. 2534-2545.*
Ahmed et al., "Reliable Cache Design With On-Chip Monitoring of NBTI Degradation in SRAM Cells Using BIST", VTS, Apr. 2010, pp. 63-68.
Bhavnagarwala et al., "A Sub-600-mV, Fluctuation Tolerant 65-nm CMOS SRAM Array With Dynamic Cell Biasing", IEEE Journal of Solid-State Circuits, Apr. 2008, pp. 946-955.
Park et al., "A Power-Efficient Wireless System With Adaptive Supply Control for Deep Brain Stimulation", IEEE Journal of Solid-State Circuits, Sep. 2013, pp. 2203-2216.

(Continued)

*Primary Examiner* — Harry W Byrne
*Assistant Examiner* — Lance Reidlinger
(74) *Attorney, Agent, or Firm* — Byrne Poh LLP

(57) ABSTRACT

Circuits for estimating threshold voltages of transistors in memory device bitcells are provided. The circuits use a multiplexer, a sensor switch network, a power switch network, and an NMOS device configured as a sensor to couple a desired one the transistors in the bitcells and the NMOS device to each other, to a test voltage, and to ground. A sensor voltage node can then be measured, and based on the resulting measurement, a threshold voltage for the transistor estimate.

11 Claims, 13 Drawing Sheets

(56) References Cited

OTHER PUBLICATIONS

Kumar, S. V., "Impact of NBTI on SRAM Read Stability and Design for Reliability", In the International Symposium on Quality Electronic Design, Mar. 2006, pp. 210-218.

Seok et al., "A Portable 2-Transistor Picowatt Temperature-Compensated Voltage Reference Operating at 0.5V", In IEEE Journal of Solid-State Circuits, Oct. 2012, pp. 2534-2545.

Singh et al., "Dynamic NBTI Management Using a 45nm Mulit-Degradation Sensor", IEEE Transactions on Circuits and Systems, Sep. 2011, pp. 2026-2037.

Teng et al., "14.7 In-Situ Techniques for In-Field Sensing of NBTI Degradation in an SRAM Register File", In the Proceedings of the IEEE Interantional Solid-State Circuits Conference, San Francisco CA, Feb. 2015, pp. 1-3.

Tsai et al., "SRAM Stability Characterization Using Tunable Ring Oscillators in 45nm CMOS", ISSCC, Feb. 2010, pp. 354-355.

Yoshimoto et al, "NMOS-inside 6T SRAM Layout Reducing Neutron Induced Mulitple Cell Upsets", IRPS, Apr. 2012, pp. 1-5.

* cited by examiner

1

CIRCUITS, METHODS, AND MEDIA FOR DETECTING AND COUNTERING AGING DEGRADATION IN MEMORY CELLS

CROSS-REFERENCE TO RELATED APPLICATION

The application claims the benefit of U.S. Patent Application No. 62/113,392, filed Feb. 7, 2015, which is hereby incorporated by reference herein in its entirety.

STATEMENT REGARDING GOVERNMENT FUNDED RESEARCH

This invention was made with government support under contract number 1453142 awarded by National Science Foundation. The government has certain rights in the invention.

BACKGROUND

Static Random Access Memory (SRAM) devices have sensitive circuitry and often operate with high switching activity and at high temperature. This makes the transistors that make up their bitcells particularly vulnerable to various aging mechanisms including Negative Bias Temperature Instability (NBTI) and Positive Bias Temperature Instability (PBTI) degradation. NBTI and PBTI change transistor threshold voltages ($V_{TH}$) over time and are major reliability concerns in modern system on a chip (SoC) designs. Since such aging effects can degrade critical robustness and performance metrics, such as data retention voltage (DRV) and read access time ($T_{ACC}$), it is highly desirable to provide mechanism to enable monitoring and managing aging effects upon memory devices.

SUMMARY

Circuit, methods, and media for detecting and countering aging degradation in memory cells are provided. In some embodiments, circuits for measuring threshold voltages of transistors in a memory device bitcell are provided, the circuits comprising: a multiplexer that has a plurality of pairs of inputs, each connected to a different pair of bitlines of the memory device, and that has an output connected to a pair of bitline terminals; a first plurality of interconnected switches that are connected to a ground, a test voltage, a sense voltage node ($V_{SEN}$), the pair of bitline terminals, and a pair of sensor terminals; a second plurality of interconnected switches that are connected to the test voltage, the ground, the sense voltage node ($V_{SEN}$), a positive voltage connection, an n-well connection, and a ground power connection of the bitcell; and a zero-$V_{TH}$ thick-oxide NMOS transistor having a gate, a drain, and a source, wherein the gate is connected to the source, the source is connected to the gate and one of the pair of sensor terminals; and the drain is connected to another of the pair of sensor terminals, wherein, when in a first configuration of the multiplexer, the first plurality of interconnected switches, and the second plurality of interconnected switches, a gate of a first transistor of the bitcell and one of a drain and a source of the first transistor of the bitcell are coupled to the test voltage, another of the drain and the source of the first transistor of the bitcell is coupled to the drain of the zero-$V_{TH}$ thick-oxide NMOS transistor, and the gate and the source of the zero-$V_{TH}$ thick-oxide NMOS transistor are coupled to ground.

DETAILED DESCRIPTION

In accordance with some embodiments, mechanisms, which can include circuits, methods, and media, for detecting and countering aging degradation in memory cells are provided. In some embodiments, these mechanisms can include in-situ techniques that sense the threshold voltage ($V_{TH}$) of bitcell transistors and can operate in-field by sensing $V_{TH}$ values robustly across temperature and voltage variations. In some embodiments, these techniques can: (1) be used to sense $V_{TH}$ values periodically (e.g., every several months) for evaluating the amount and the rate of NBTI and/or PBTI degradation; (2) be used to sense $V_{TH}$ values between two PMOSs in a bitcell to determine their strength skew and to estimate the minimum functional voltage ($V_{MIN}$) degradation; (3) use the sensed values to estimate data retention voltage (DRV) and read access time ($T_{ACC}$); and (4) use the information on $V_{TH}$ values and skews across bitcells to create recovery vectors which can be used to recover the aged PMOSs and thereby improve the robustness and performance of the bitcells.

Figure 1:
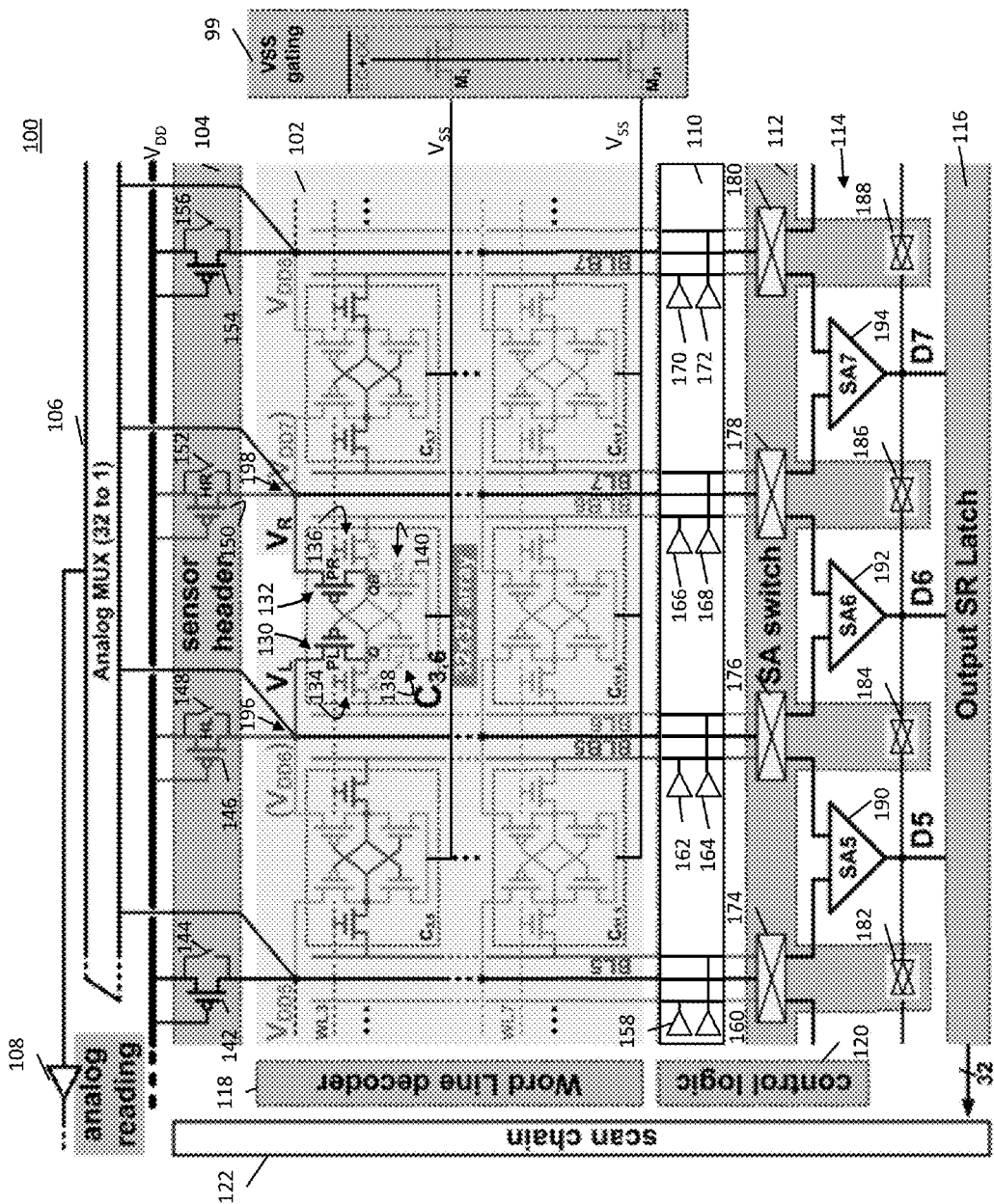
FIG. 1 is an example of a memory device include mechanisms for monitoring degradation effects on the memory device's bitcells in accordance with some embodiments.

Turning to FIG. 1, a memory device 100 in accordance with some embodiments is shown. As illustrated, the memory device includes an array 102 of bitcells, a sensor header 104, an analog multiplexer 106, an amplifier 108, bitline drivers 110 (which can include drivers 158, 160, 162, 164, 166, 168, 170, and 172), sense amplifiers switches 112 (which can include switches 174, 176, 178, 180, 182, 184, 186, and 188), sense amplifiers 114 (which can include sense amplifiers 190, 192, and 194), output SR latch 116, word line decoder 118, control logic 120, scan chain 122, and $V_{SS}$ gating circuit 99.

In some embodiments, array 102 of bitcells can include any suitable number of bitcells. For example, in some embodiments, array 102 can include a 32 by 32 array of bitcells. Each bitcell can be any suitable type of bitcell. For example, in some embodiments, each bitcell can be a six transistor (6T) bitcell. More particularly, for example, such a bitcell $C_{3,6}$ can include a transistor PL 130, a transistor PR 132, a transistor AL 134, a transistor AR 136, a transistor NL 138, and a transistor NR 140, which can be connected as shown in FIG. 1, in some embodiments.

Voltage supply lines (e.g., $V_{DD5}$, $V_{DD6}$, $V_{DD7}$, and $V_{DD8}$) can be provided between columns of cells in array 102 to power the cells in the corresponding columns. One side of these supply lines can be connected to a sensor header, which can include a header transistor HL or HR (e.g., transistors 142, 146, 150, and 154) and a bypass switch (e.g., switches 144, 148, 152, and 156) for each supply line. When memory device 102 is being used for normal memory purposes, bypass switches 144, 148, 152, and 156 can be closed to provide power from $V_{DD}$ to the supply lines.

As shown in FIG. 1, in some embodiments, a bitcell (e.g., cell $C_{3,6}$ in FIG. 1) can be configured into two $V_{TH}$ sensors. In order to enable such a configuration, the two bypass switches corresponding to the bitcell (e.g., switches 148 and 152) can be disabled (i.e., opened), a word line corresponding to the cell (e.g., WL3) can be asserted, and the bitlines corresponding to the cell (e.g., BL6 and BLB6) can be connected to ground. The bitlines corresponding to the cell can be connected to ground by suitable drivers (e.g., drivers 164 and 166) of bitline driver 110.

Figure 2:
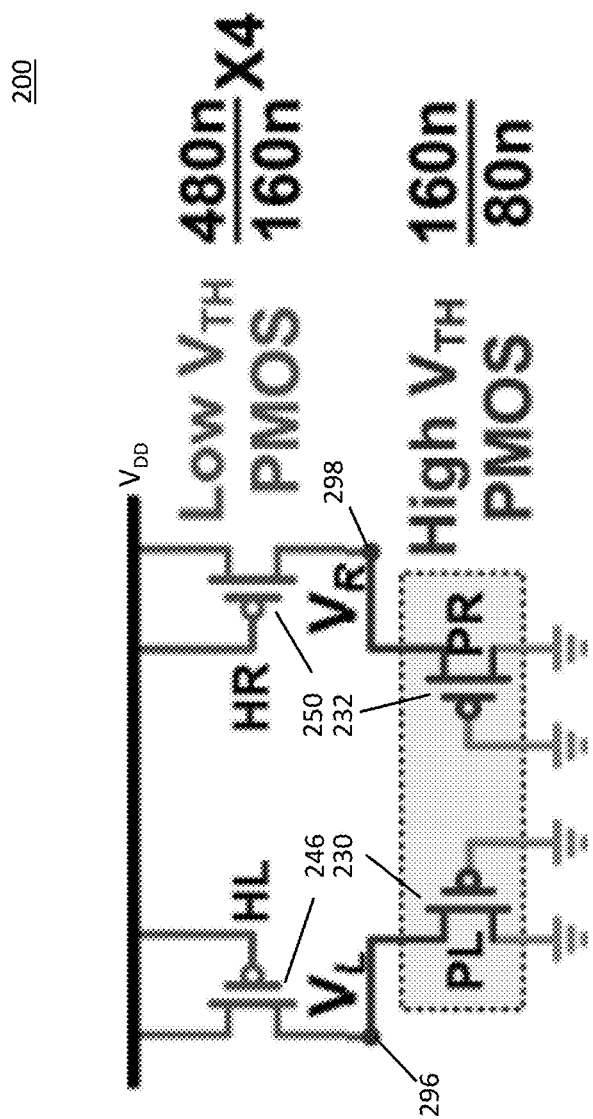
FIG. 2 is an example of a model of a configuration of four transistors of the memory device FIG. 1 when that device is in a certain configuration in accordance with some embodiments.

When device 100 is configured as described above, the circuit containing transistor PL 130, transistor PR 132, transistor HL 146, and transistor HR 150 can be represented by the circuit shown in FIG. 2. As illustrated in FIG. 2, transistor PL 230 can represent transistor PL 130 of FIG. 1, transistor PR 232 can represent transistor PR 132 of FIG. 1, transistor HL 246 can represent transistor HL 146 of FIG. 1, and transistor HR 250 can represent transistor HR 150 of FIG. 1. As shown in FIG. 2, transistors HL and transistors HR can be formed from four fingers that are 480 nm long and 160 nm wide, and the transistors PL and PR can be formed from one finger that is 160 nm long and 80 nm wide.

Returning to FIG. 1, the voltage $V_L$ at node 196 ($V_{DD6}$) and the voltage $V_R$ at node 198 ($V_{DD7}$) are linear functions of the threshold voltage ($V_{TH}$) of transistor PL 130 and transistor PR 132, respectively, of bitcell $C_{3,6}$. Analytical expressions for $V_L$ an $V_R$ can be derived based on the fundamentals of a compact voltage reference as described in M. Seok, et al., "A Portable 2-Transistor Picowatt Temperature-Compensated Voltage Reference Operating at 0.5V," IEEE Journal of Solid-State Circuits, vol. 47, no. 10, pp. 2534-2545, October 2012, which is hereby incorporated by reference herein in its entirety. More particularly, $V_L$ can be represented by:

$$V_L = |V_{thPL}| + n_{PL}\left[\Phi_t \ln\left(\frac{\beta_{HL}}{\beta_{PL}} \cdot \frac{n_{HL}-1}{n_{PL}-1}\right) + \frac{1}{n_{HL}}|V_{thHL}|\right].$$

Likewise, $V_R$ can be represented by:

$$V_R = |V_{thPR}| + n_{PR}\left[\Phi_t \ln\left(\frac{\beta_{HR}}{\beta_{PR}} \cdot \frac{n_{HR}-1}{n_{PR}-1}\right) + \frac{1}{n_{HR}}|V_{thHR}|\right]$$

where:
$V_{thPL}$ is the threshold voltage of transistor PL 130;
$V_{thPR}$ is the threshold voltage of transistor PR 132;
$V_{thHL}$ is the threshold voltage of transistor HL 146;
$V_{thHR}$ is the threshold voltage of transistor HR 150;
$n_{PL}$ is a subthreshold slope factor of transistor PL 130;
$n_{PR}$ is a subthreshold slope factor of transistor PR 132;
$n_{HL}$ is a subthreshold slope factor of transistor HL 146;
$n_{HR}$ is a subthreshold slope factor of transistor HR 150;
$\Phi_t$ is a thermal voltage (=kT/q where k is boltzman constant, T is temperature, q is electron charge);
$\beta_{PL}$ is u*Cox*W/L (where u is mobility, Cox is gate oxide capacitance density, W and L are width and length) of transistor PL 130;
$\beta_{PR}$ is u*Cox*W/L (where u is mobility, Cox is gate oxide capacitance density, W and L are width and length) of transistor PR 132;
$\beta_{HL}$ is u*Cox*W/L (where u is mobility, Cox is gate oxide capacitance density, W and L are width and length) of transistor HL 146; and
$\beta_{HR}$ is u*Cox*W/L (where u is mobility, Cox is gate oxide capacitance density, W and L are width and length) of transistor HR 150;
Because $$n_{PL}\left[\Phi_t \ln\left(\frac{\beta_{HL}}{\beta_{PL}} \cdot \frac{n_{HL}-1}{n_{PL}-1}\right) + \frac{1}{n_{HL}}|V_{thHL}|\right]$$

and $n_{PR}\left[\Phi_t \ln\left(\frac{\beta_{HR}}{\beta_{PR}} \cdot \frac{n_{HR}-1}{n_{PR}-1}\right) + \frac{1}{n_{HR}}|V_{thHR}|\right]$ are approximately equal in a typical bitcell, the difference between $V_L$ and $V_R$ can be represented as:

$$V_D = V_L - V_R \approx |V_{thPL}| - |V_{thPR}|.$$

The analytical expressions for $V_L$ and $V_R$ are linear functions of the threshold voltages of transistor PL 130 ($V_{thPL}$) and transistor PR 130 ($V_{thPR}$), and not a strong function of temperature and voltage. Thus, the described configuration can be used to robustly monitor the $V_{thPL}$ and $V_{thPR}$ under operational temperature and voltage variations by monitoring $V_L$ and $V_R$, respectively.

The sensor header transistors HL and HR can be sized, in some embodiments, so that the voltages $V_L$ and $V_R$ are sensitive mostly to $V_{thPL}$ and $V_{thPR}$, respectively.

In some embodiments, the sensors can also estimate the $V_{MIN}$ changes due to NBTI degradation. If a bitcell has Q=1 and QB=0, transistor PL ages and the bitcell flips to Q=0 at a higher $V_{MIN}$.

To improve the accuracy of the threshold voltage estimates (based on $V_L$ and $V_R$) in a bitcell, the circuit can be configured to mitigate leakage current from nearby bitcells in some embodiments. For example, in some embodiments, when a cell (e.g., $C_{3,6}$) is configured for sensing, it may be desirable to prevent cells from the unselected rows from contributing leakage currents to $V_L$ and $V_R$. To reduce those leakage currents, in some embodiments, the $V_{SS}$ voltages from the unselected rows can be gated during sensing. In some embodiments, this can be accomplished using $V_{SS}$ gating circuit 99 shown in FIG. 1. In some embodiments, it may also be desirable to mitigate leakage currents from adjacent cells of the same row (e.g., cells $C_{3,5}$, $C_{3,7}$), which may induce leakage currents depending on their stored bits. To mitigate such leakage currents, in some embodiments, bitlines in the adjacent columns (e.g., BL5, BLB5, BL7, BLB7) can be pulled to $V_{DD}$ by the drivers (e.g., drivers 160, 162, 168, and 170) in bitline drivers 110 to turn off the PMOS devices in the adjacent cells (e.g., cells $C_{3,5}$ and $C_{3,7}$). This can also help reduce pass-transistor leakage in the other rows of the column.

The voltages $V_L$ and $V_R$ can be transferred via 32-to-1 analog multiplexer 106 through an amplifier 108 to an analog-to-digital conversion for digitization and subsequent processing by any suitable component (such as a microprocessor), in some embodiments.

In some embodiments, besides being digitized with an analog-to-digital converter, voltages $V_L$ and $V_R$ can also be compared via sense amplifiers (SA) 114 that are normally part of an SRAM device. This approach can determine the PMOS strength skew of a line of bitcells at a higher throughput with the parallel use of any suitable number of sense amplifiers.

In order to connect voltages $V_L$ and $V_R$ to the sense amplifiers, sense amplifier switches (e.g., switches 174, 176, 178, and 180) can be provided to connect the voltage supply lines (e.g., $V_{DD5}$, $V_{DD6}$, $V_{DD7}$, and $V_{DD8}$) to the sense amplifiers (e.g., sense amplifiers 190, 192, and 194). The outputs of the sense amplifiers can be combined by sense amplifiers switches (e.g., switches 182, 184, 186, and 188) so that a combined output of two or more sense amplifiers can be measured.

Figure 3:
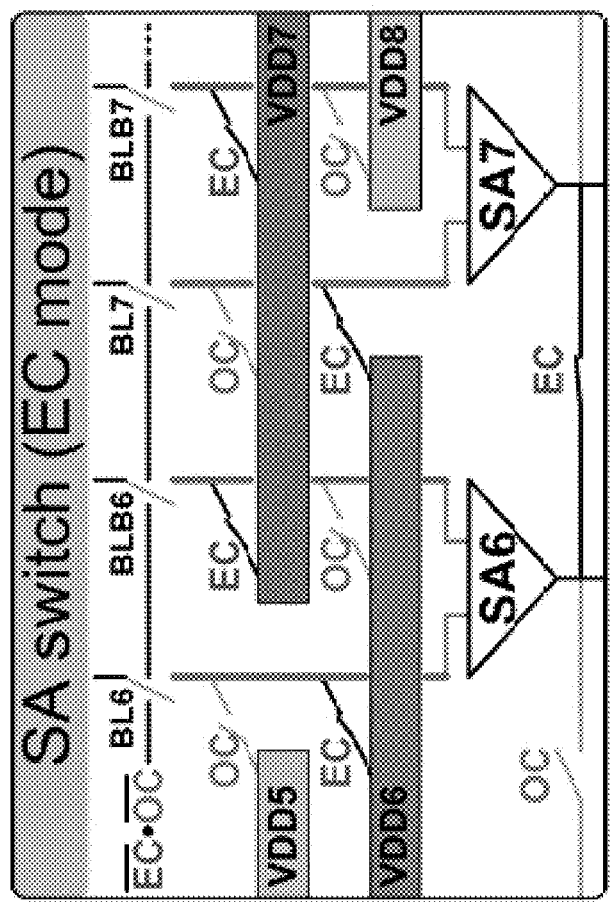
FIG. 3 is an example of a diagram showing connections between power supply lines and sense amplifiers in even cycles and odd cycles in accordance with some embodiments.

To generate a word-size (32 bits in the device of FIG. 1) recovery vector, the techniques described above can take two cycles: one for the even columns (EC) and the other for the odd columns (OC), since, as described above, measurements cannot be made from two adjacent bitcells simultaneously. FIG. 3 illustrates an example of how the two cycles can be implemented. As shown, during an even cycle, columns 0, 2, 4, 6, . . . , 30 can be measured. During an odd cycle, columns 1, 3, 5, 7, . . . , 31 can be measured.

When in an even cycle, the switches marked "EC" in FIG. 3 are closed and the switches marked "OC" in FIG. 3 are open. Thus, in when in an even cycle, as shown in FIG. 3, the bitlines BL6, BLB6, BL7, and BLB7 are disconnected from VDD (as shown by the switches at the top of the figure), bitline BL6 is connected to VDD6, bitline BLB6 is connected to VDD7, BL7 is connected to VDD6, and BLB7 is connected to VDD7. In this way, sense amplifier six (SA6) and sense amplifier seven (SA7) are each connected to VDD6 and VDD7. Thus, each of sense amplifiers six and seven is measuring the same two bitlines (i.e., VDD6 and VDD7).

Similarly, when in an odd cycle, the switches marked "OD" in FIG. 3 are open and the switches marked "OC" in FIG. 3 are closed. Thus, in when in an odd cycle, the bitlines BL6, BLB6, BL7, and BLB7 are disconnected from VDD (as shown by the switches at the top of the figure), bitline BL6 is connected to VDD5, bitline BLB6 is connected to VDD6, BL7 is connected to VDD7, and BLB7 is connected to VDD8. In this way, sense amplifier six (SA6) is connected to VDD5 and VDD6 and sense amplifier seven (SA7) is connected to VDD7 and VDD8. Though not shown in FIG. 3, it follows that sense amplifier five (SA5) would also be connected to VDD5 and VDD6 and that sense amplifier eight (SA8) would also be connected to VDD7 and VDD8. Thus, sense amplifiers five and six would be measuring the same two bitlines (i.e., VDD5 and VDD6) and sense amplifiers seven and eight would be measuring the same two bitlines (i.e., VDD7 and VDD8).

Using two sense amplifiers per column (one from its own column and the other from an adjacent column) in this way can reduce input-referred offset. In some embodiments, the sense amplifier size can be increased by 1.5× over what might be used in a similar memory device (not including the VL and VR measurement mechanisms described herein) for further offset mitigation.

Figure 4:
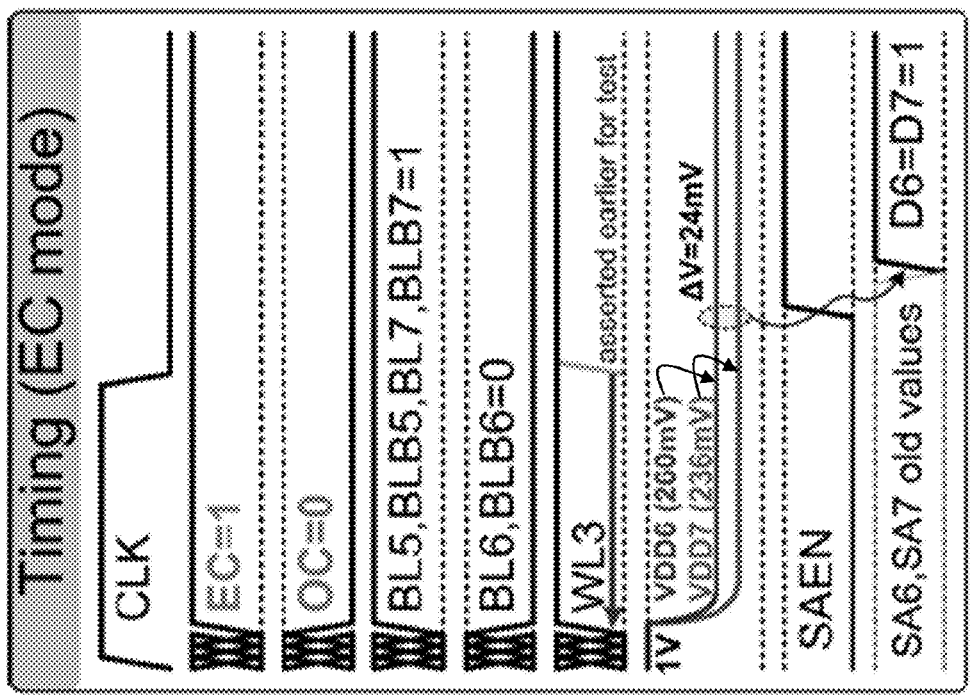
FIG. 4 is an example of a timing diagram of signals of the memory device of FIG. 1 during an even cycle in accordance with some embodiments.

The operational waveforms during EC mode in some embodiments are shown FIG. 4. As illustrated, the word line (e.g., WL3) can be asserted a half-cycle earlier than during normal operation to provide enough settling time for VDD6 and VDD7 before the SAs compare $V_L$ and $V_R$.

Additionally or alternatively to using sense amplifiers to compare $V_L$ and $V_R$ as described above, in some embodiments any suitable amplifier with accuracy better than the sense amplifiers can be coupled to the sense amplifier inputs via an analog multiplexer and used to measure the difference between $V_L$ and $V_R$.

Figure 5:
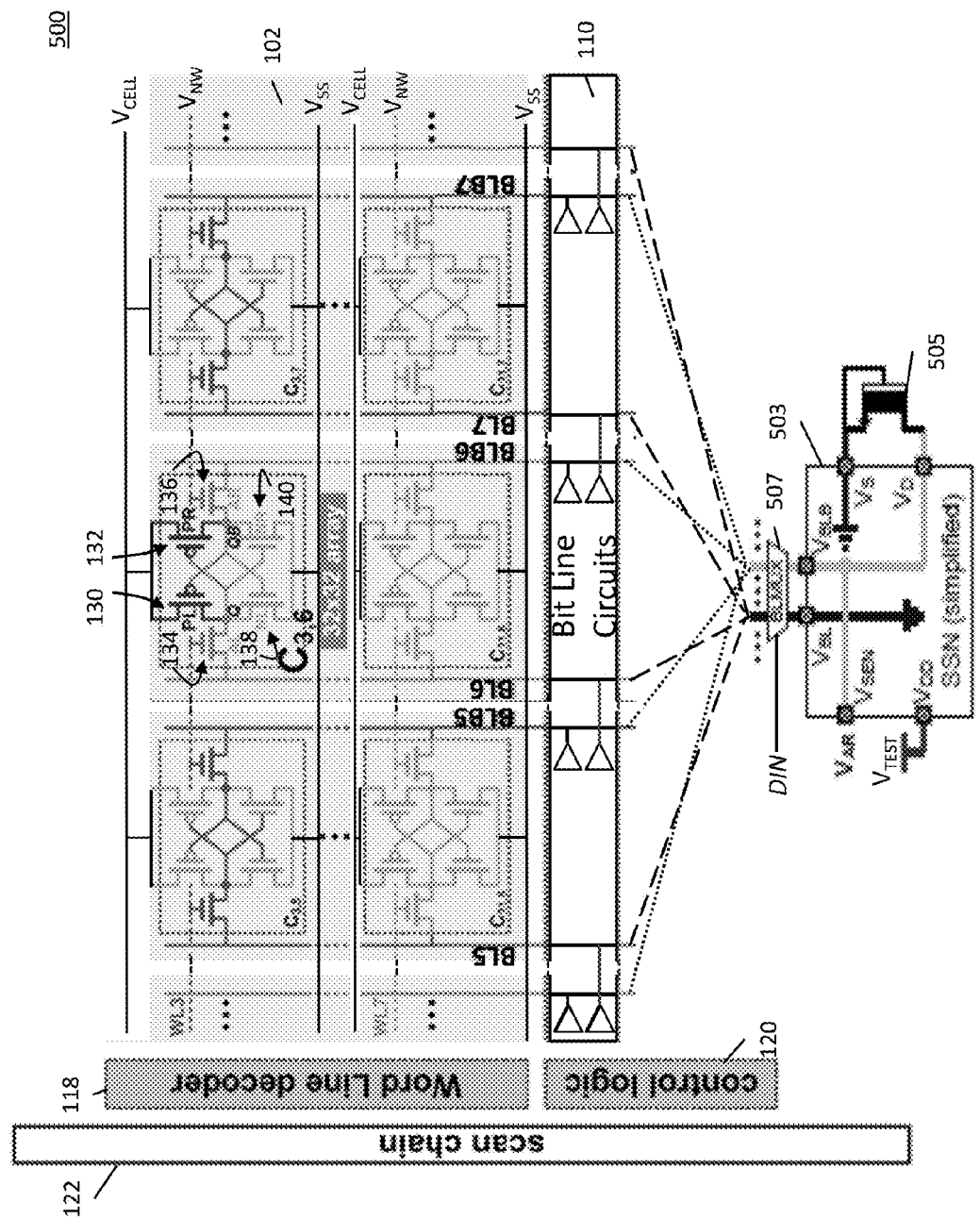
FIG. 5 is another example of a memory device include mechanisms for monitoring degradation effects on the memory device's bitcells in accordance with some embodiments.

Turning to FIG. 5, another approach to determining threshold voltage $V_{TH}$ degradation of memory cell transistors in accordance with some embodiments is shown. As illustrated, a memory device 500 can include an array 102 of bitcells, bitline circuits 110 (which can include bitline prechargers, write drivers, sensing amplifiers and/or any other suitable components), a word line decoder 118, control logic 120, a scan chain 122, a sensor switch network (SSN) 503, and a zero-$V_{TH}$ thick-oxide NMOS transistor (referred to herein as a sensor) 505, and a bitline multiplexer (BLMUX) 507.

Figure 6:
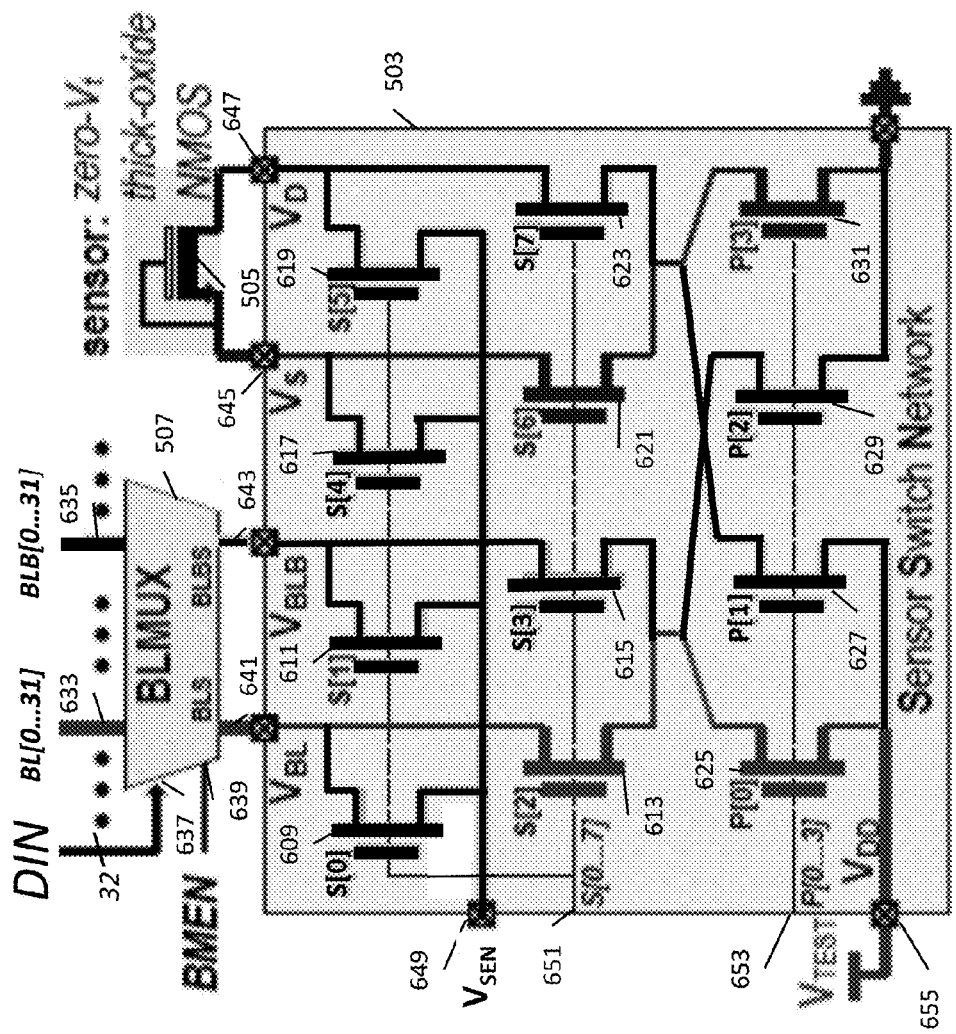
FIG. 6 is an example of a bitline multiplexer, a sensor switch network, and a sensor that can be used in the memory device of FIG. 5 in accordance with some embodiments.

FIG. 6 shows sensor switch network 503, sensor 505, and BLMUX 507 in more detail. As illustrated, bitlines BL0 . . . BL31 and bitlines BLB0 . . . BLB31 are received by BLMUX 507. One of each of bitlines BL0 . . . BL31 and bitlines BLB0 . . . BLB31 are selected by BLMUX 507 in response to values on DIN. When a bitline multiplexer enable signal (BMEN) is asserted, BLMUX outputs the selected ones of bitlines BL0 . . . BL31 and bitlines BLB0 . . . BLB31 as BLS and BLBS.

Figure 8:
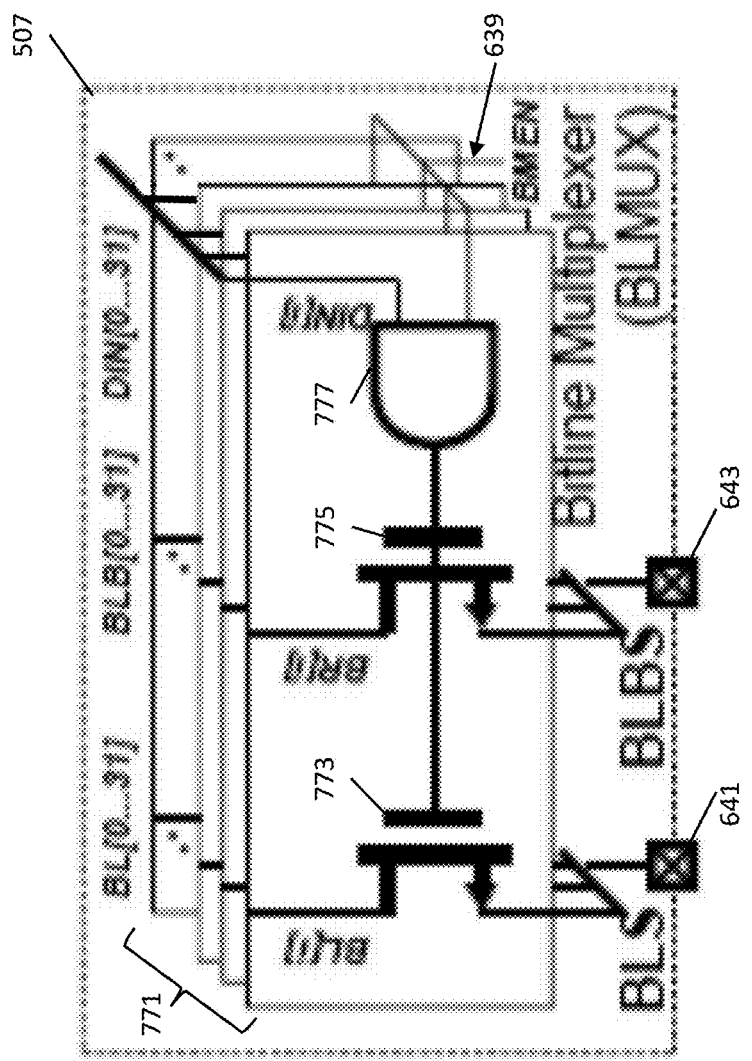
FIG. 8 is an example of a bitline multiplexer that can be used in the memory device of FIG. 5 in accordance with some embodiments.

An example of BLMUX 507 is shown in FIG. 8. As illustrated, BLMUX 507 can be implemented by providing a set (in the figure, 32) branches 771 that are connected in parallel to BLS node 641, BLBS node 643, and BMEN node 639. One of each of BL0 . . . BL31, BLB0 . . . BLB31, and DIN0 . . . DIN31 are provided to transistor 773, transistor 775, and AND gate 777, respectively, of each branch as shown.

Sensor switch network 503 receives BLS and BLBS and connects them to sensor 505, $V_{SEN}$, $V_{TEST}$, and/or ground based upon signals S0 . . . S7 and P0 . . . P3, which turn on one or more of transistors S[0] 609, S[1] 611, S[2] 613, S[3] 615, S[4] 617, S[5] 619, S[6] 621, and S[7] 623 and transistors P[0] 625, P[1] 627, P[2] 629, and P[3] 631, respectively.

Figure 7:
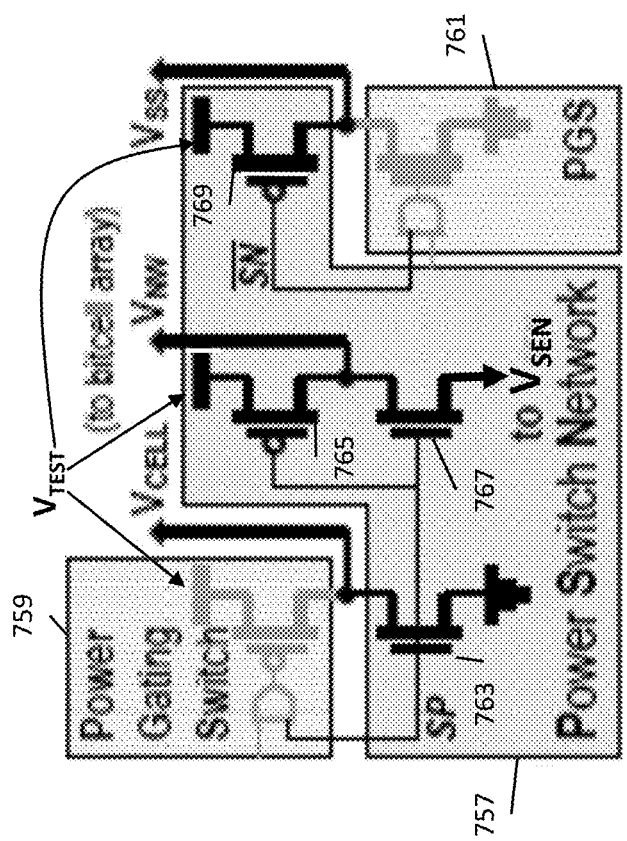
FIG. 7 is an example of a power switch network that can be used in conjunction with the memory device of FIG. 5 in accordance with some embodiments.

The $V_{CELL}$, $V_{NW}$, and $V_{SS}$ connections to each bitcell can be connected to power switch network (PSN) 757 as shown in FIG. 7 in some embodiments. The PSN can control whether $V_{CELL}$ is connected to $V_{TEST}$ or ground, whether $V_{NW}$ is connected to $V_{TEST}$ or $V_{SEN}$, and whether $V_{SS}$ is connected to $V_{TEST}$ or ground. As illustrated, PSN 757 includes transistors 763, 765, 767, and 769 which are connected as shown and controlled by signals SP and $\overline{SN}$ (SNb). As also shown in FIG. 7, power gating switches 759 and 761 can be provided to control power to the memory device. $V_{TEST}$ can be set to 0.6V or any other suitable voltage in some embodiments.

By configuring the inputs described above, BLMUX 507, SSN 503, and PSN 757 can select one of transistor PL 130, transistor PR 132, transistor AL 134, transistor AR 136, transistor NL 138, and transistor NR 140 as a device under test (DUT) as shown in the following table:

| DUT | SSN conf. (ON) | BMEN/SP/SNb |
|-----|----------------|-------------|
| PL  | S[0,3,4,7] P[1,2] | 1/1/1 |
| PR  | S[1,2,4,7] P[1,2] |       |
| AL  | S[0,3,5,6] P[2,3] | 1/0/1 |
| AR  | S[1,2,5,6] P[2,3] |       |
| NL  | S[0,3,5,6] P[0,3] | 1/0/0 |
| NR  | S[1,2,5,6] P[0,3] |       |

Figure 9:
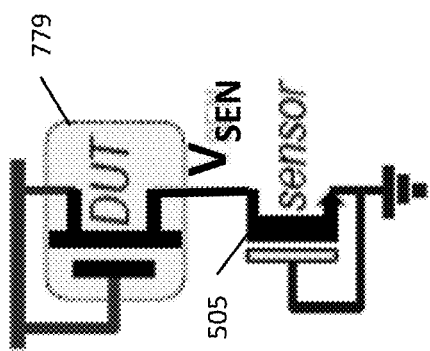
FIG. 9 is an example of a model of the connections between a device under test and a sensor in a certain configuration of the memory device of FIG. 5 in accordance with some embodiments.

More particularly, for example, to select transistor NR 140 as the device under test: (1) the PSN connects the power nodes of the array ($V_{CELL}$, $V_{NW}$, and $V_{SS}$) to $V_{TEST}$ (0.6V) by setting SP=0 and SNb=0; (2) the word-line (WL3), the input data bus (DIN), and the BLMUX enable signal (BMEN) are set to 1, 00000010 . . . 0, 1, respectively, to transfer the voltages of the bitlines of C3,6 (BL6, BLB6) to the SSN via the BLMUX; and (3) the SSN is configured by turning on S[1,2,5,6] and P[0,3]. As a result, as shown in FIG. 9, transistor NR 140 is selected as the device under test 779 and connected to sensor 505. Specifically, as shown in FIG. 6, $V_{BL}$ (BL6) is coupled to $V_{TEST}$; $V_{BLB}$ (BLB6) becomes $V_D$ (the drain of the sensor); Vs (the source of the sensor) becomes ground. The output voltage of the circuits, $V_{SEN}$, becomes a linear function of the $V_{TH}$ of transistor NR 140, and also generally insensitive to temperature variation, based on the fundamentals of the voltage reference circuits. Because $V_{SEN}$ is a linear function of $V_{TH}$, once a relationship between $V_{SEN}$ and $V_{TH}$ is determined (e.g., by testing), a measurement of $V_{SEN}$ can be used to estimate $V_{TH}$.

Figure 10:
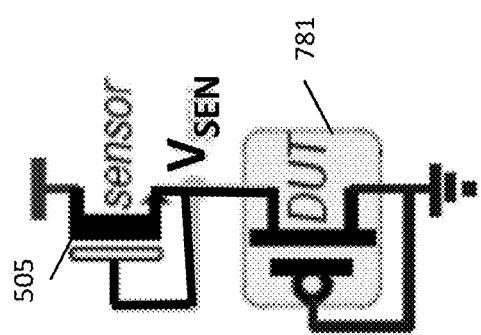
FIG. 10 is an example of another model of the connections between a device under test and a sensor in a certain configuration of the memory device of FIG. 5 in accordance with some embodiments.

Similarly, as described above, the inputs can be configured for sensing transistor PR 132. When the BLMUX, the PSN, and the SSN are properly configured, as shown in FIG. 10, transistor PR 132 becomes device under test 781 and is connected to sensor 505 as shown.

In some embodiments, the bias current of the $V_{TH}$ sensor circuits can be provided at the μA level to make sensing robust against gate and sub-threshold leakage of nearby devices. This also allows the BLMUX and the PSN to be implemented using thin-oxide devices, in some embodiments. When sensing PMOS, the PSN also connects the n-well of the array ($V_{NW}$) to $V_{SEN}$ for removing the body effect, improving robustness against temperature variation.

Figure 11:
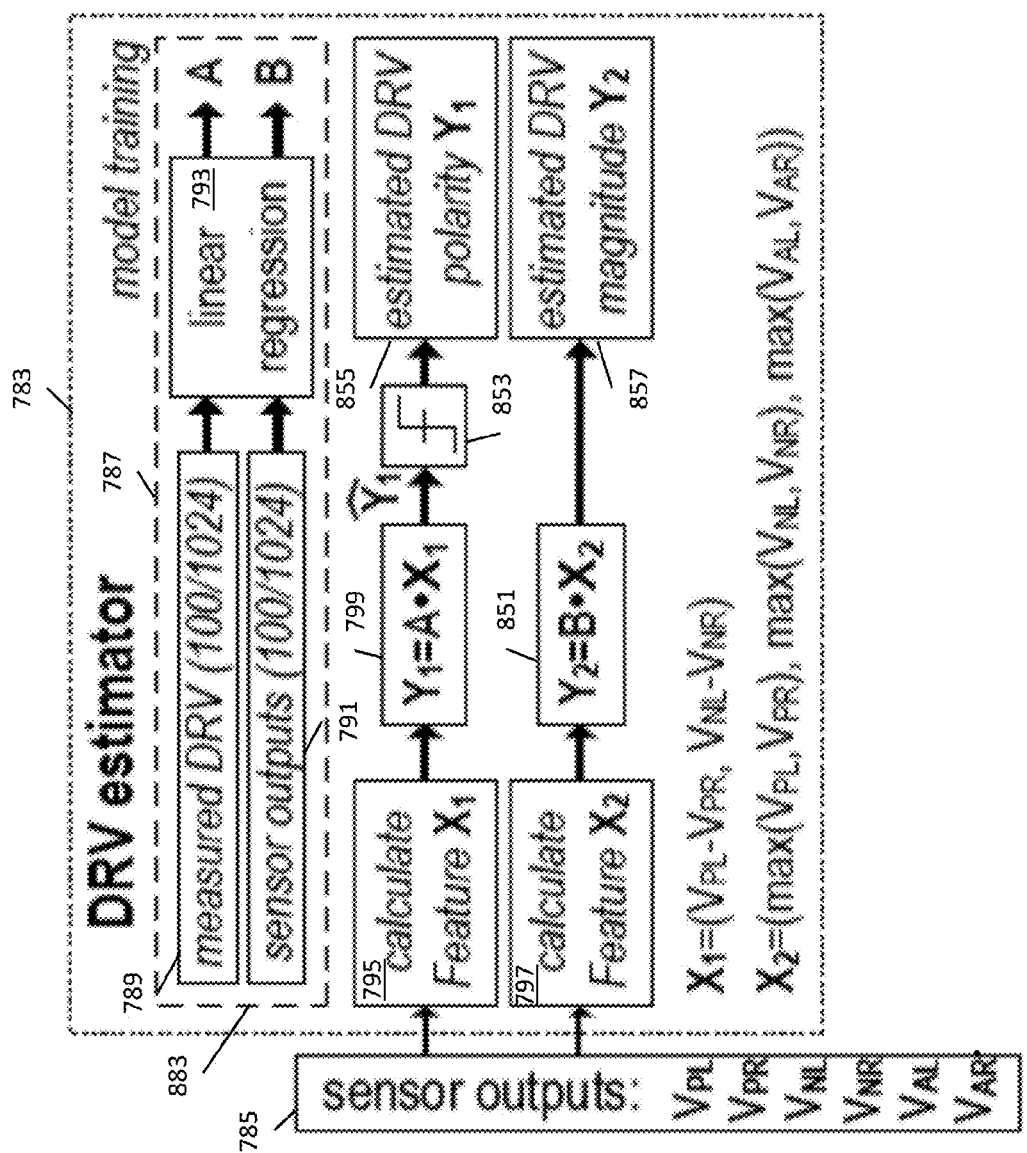
FIG. 11 is an example of a block diagram of a data retention voltage (DRV) estimator that can be implemented in conjunction with the memory device of FIG. 5 in accordance with some embodiments.

In some embodiments, data retention voltage (DRV) can be estimated based on sensed values as input over a memory device's lifetime. As shown in FIG. 11, in order to estimate DRV, six sensor outputs 785 per bitcell can be taken as input and used to generate the estimates of DRV polarity ($Y_1$) and magnitude ($Y_2$) using a DRV estimator 783. The DRV polarity ($Y_1$) represents the DRV's skew. For example, the polarity is negative if a bitcell is less likely to retain 0 than 1 at Q node at a low VDD value.

In order to estimate DRV, first, using a reference memory device, two matrices, A and B, are found via linear regression 793 using measured DRVs 789, polarity feature vectors $X_1$ at 883, and magnitude feature vectors $X_2$ at 883 of 100 bitcells from the reference memory device using the equations shown in boxes 799 and 851. The polarity feature vector and the magnitude feature vector for the cells are calculated as follows:

$$X_1 = (V_{PL} - V_{PR}, V_{NL} - V_{NR}); \text{ and}$$

$$X_2 = (\max(V_{PL}, V_{PR}), \max(V_{NL}, V_{NR}), \max(V_{AL}, V_{AR})),$$

where:
$V_{PL}$ is the value of $V_{SEN}$ when transistor PL is the device under test;
$V_{PR}$ is the value of $V_{SEN}$ when transistor PR is the device under test;
$V_{AL}$ is the value of $V_{SEN}$ when transistor AL is the device under test;
$V_{AR}$ is the value of $V_{SEN}$ when transistor AR is the device under test;
$V_{NL}$ is the value of $V_{SEN}$ when transistor NL is the device under test; and
$V_{NR}$ is the value of $V_{SEN}$ when transistor NR is the device under test.

After aging a different memory device (e.g., through normal use or using an accelerated aging test) and measuring sensor outputs 785 for the device, the sensor outputs can be used to calculate $X_1$ and $X_2$ at 795 and 797, respectively. $X_1$, $X_2$, A, and B can then be used to calculate $Y_1$ and $Y_2$ at 799 and 851. $Y_1$ is then thresholded by 853 (so that the polarity is considered to be + if $Y_1$ is over a threshold and − otherwise) and the estimated DRV polarity $Y_1$ and the estimated DRV magnitude $Y_2$ are provided at 855 and 857, respectively.

Figure 12:
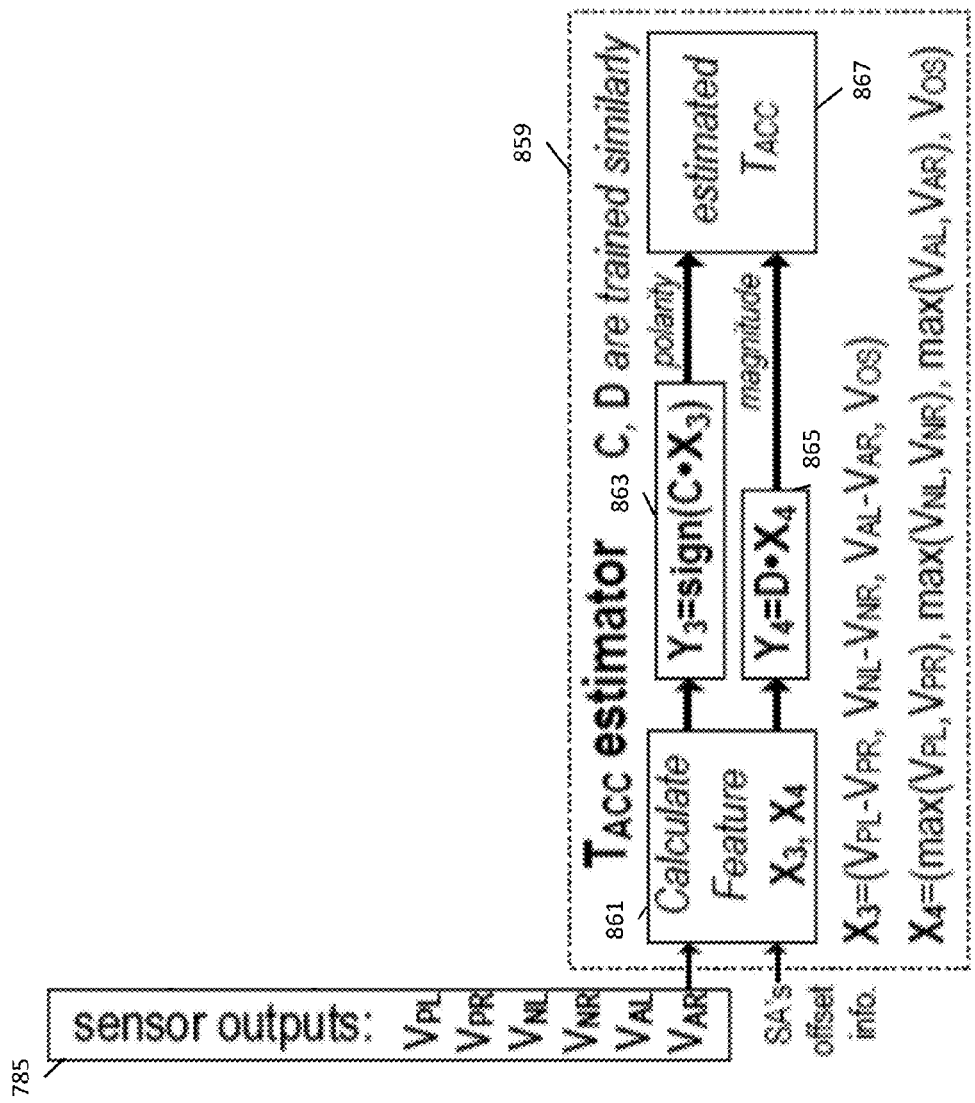
FIG. 12 is an example of a block diagram of a read access time ($T_{ACC}$) estimator that can be implemented in conjunction with the memory device of FIG. 5 in accordance with some embodiments.

In some embodiments, read access time ($T_{ACC}$) can also be estimated by taking sensed values as input over a memory device's lifetime. As shown in FIG. 12, in order to estimate $T_{ACC}$, six sensor outputs 785 per bitcell and sense amplifier offset information can be taken as input and used to generate the estimates of $T_{ACC}$ polarity ($Y_3$) and $T_{ACC}$ magnitude ($Y_4$) using $T_{ACC}$ estimator 859. $T_{ACC}$ is a function of the relative strength between PU (i.e., transistor PL or PR), PD (i.e., transistor NL or NR), and AX (transistor AL or AR) of a bitcell and the sense amplifier's input-referred offset voltage ($V_{OS}$). $T_{ACC}$ polarity is 0 if reading Q=0 has larger $T_{ACC}$ than reading Q=1.

In order to estimate $T_{ACC}$, first, using a reference memory device, two matrices, C and D, can be found via linear regression using measured $T_{ACC}$s, polarity feature vectors $X_3$, and magnitude feature vectors $X_4$ of 100 bitcells from the reference memory device. The polarity feature vector and the magnitude feature vector for the cells can then be calculated as follows:

$$X_3 = (V_{PL} - V_{PR}, V_{NL} - V_{NR}, V_{AL} - V_{AR}, V_{OS}); \text{ and}$$

$$X_4 = (\max(V_{PL}, V_{PR}), \max(V_{NL}, V_{NR}), \max(V_{AL}, V_{AR}), \max(V_{OS})).$$

After aging a different memory device (e.g., through normal use or using an accelerated aging test) and measuring sensor outputs 785 for the device, the sensor outputs and sense amplifier offset information can be used to calculate $X_3$ and $X_4$ at 861. $X_3$, $X_4$, C, and D can then be used to calculate $Y_3$ and $Y_4$ at 863 and 865. The estimated $T_{ACC}$ polarity $Y_3$ and the estimated $T_{ACC}$ magnitude $Y_4$ can then be provided at 867.

The polarity of $T_{ACC}$ ($Y_3$), which is 0 if reading Q=0 has larger $T_{ACC}$ than reading Q=1, and the magnitude of $T_{ACC}$ ($Y_4$) can be provided at 867.

Figure 13:
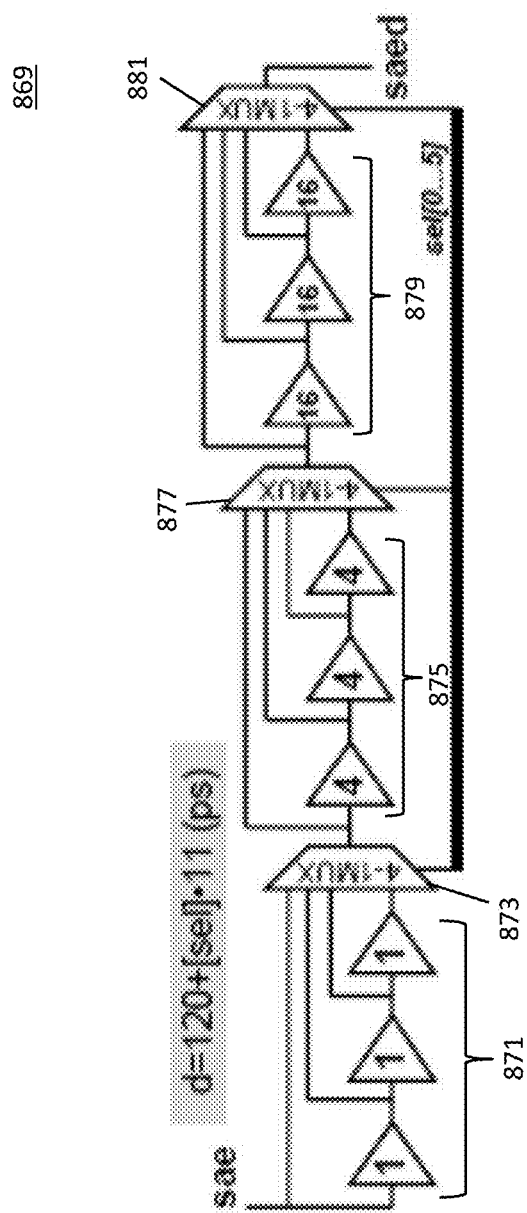
FIG. 13 is an example of a configurable delay line in accordance with some embodiments.

To estimate the impact of $V_{OS}$ on $T_{ACC}$, a configurable delay line (e.g., as shown in FIG. 13) can be used to add delays to a sense amplifier's enable signal (sae) to provide a delayed sense amplifier enable signal (saed). The delay be this delay line can then be changed and $T_{ACC}$ measured repeatedly to observe the impact of different delays.

As shown in FIG. 13, an example of a configurable delay line 869 can include a plurality of buffer chains 871, 875, and 879, where each buffer includes a certain delay factor (e.g., 1, 4, and 16 as illustrated for the buffers in chains 871, 875, and 879, respectively). After each chain, multiplexers 873, 877, and 881 can be used to select a suitably delayed signal from a point in the preceding chain and provide it to the next chain or the output (saed).

Strength skews of bitcells in an SRAM device can be measured using the mechanisms described herein. These measurements can show inherent skews incurred by process variations and/or any other skews. Based on the measured skew, recovery vectors can be determined and applied to some of the bitcells, in some embodiments.

In some embodiments, if a bitcell is identified as having a given level of degradation, any suitable action can be taken. For example, in some embodiments, the bitcell can be flagged as not-to-be used. As another example, in some embodiments, recovery vectors can be applied to a bitcell to counter NBTI degradation. These recovery vectors can be applied, for example, as described in S. V. Kumar, et al., "Impact of NBTI on SRAM Read Stability and Design for Reliability," In International Symposium on Quality Electronic Design, pp. 210-218, 2006, which is hereby incorporated by reference herein in its entirety.

Although the mechanisms described herein are illustrated using a six transistor bit cell, these mechanisms can be used with other forms of bitcells in some embodiments. For example, these mechanisms can be used with 4-transistor (4-T), 5-T, 8-T, 7-T, 8-T, 10-T, 12-T, 14-T, and many other SRAM circuit designs.

Although not shown in the figures, the header devices (e.g., transistors HL and HR and bypass switches), the word lines (e.g., WL3), the bitlines drivers (e.g., for BL6, BLB6), the bitline circuits, the VSS gating, the analog multiplexer, an analog-to-digital converter, the sense amplifier switches, the sense amplifiers, the output SR latch, the DRV estimator, the $T_{ACC}$ estimator, and/or any other components can be controlled by any suitable hardware, software, firmware, and/or look-up tables. For example, in some embodiments, a microprocessor running any suitable instructions can control the configuration of the sensors, measurements, and recovery processes described herein.

In some embodiments, any suitable computer readable media can be used for storing instructions for performing the processes described herein. For example, in some embodiments, computer readable media can be transitory or non-transitory. For example, non-transitory computer readable media can include media such as magnetic media (such as hard disks, floppy disks, and/or any other suitable media), optical media (such as compact discs, digital video discs, Blu-ray discs, and/or any other suitable optical media), semiconductor media (such as flash memory, electrically programmable read only memory (EPROM), electrically erasable programmable read only memory (EEPROM), and/or any other suitable semiconductor media), any suitable media that is not fleeting or devoid of any semblance of permanence during transmission, and/or any suitable tangible media. As another example, transitory computer readable media can include signals on networks, in wires, conductors, optical fibers, circuits, any suitable media that is fleeting and devoid of any semblance of permanence during transmission, and/or any suitable intangible media.

The provision of the examples described herein (as well as clauses phrased as "such as," "e.g.," "including," and the like) should not be interpreted as limiting the subject matter to the specific examples; rather, the examples are intended to illustrate only some of many possible aspects.

Although the invention has been described and illustrated in the foregoing illustrative embodiments, it is understood that the present disclosure has been made only by way of example, and the numerous changes in the details of implementation of the invention can be made without departing from the spirit and scope of the invention, which is limited only by the claims that follow. Features of the disclosed embodiments can be combined and rearranged in various ways.

What is claimed is:

1. A circuit for measuring threshold voltages of transistors in a memory device bitcell, comprising:
   a multiplexer that has a plurality of pairs of inputs, each connected to a different pair of bitlines of the memory device, and that has an output connected to a pair of bitline terminals;
   a first plurality of interconnected switches that are connected to a ground, a test voltage, a sense voltage node ($V_{SEN}$), the pair of bitline terminals, and a pair of sensor terminals;
   a second plurality of interconnected switches that are connected to the test voltage, the ground, the sense voltage node ($V_{SEN}$), a positive voltage connection, an n-well connection, and a ground power connection of the bitcell; and
   a zero-$V_{TH}$ thick-oxide NMOS transistor having a gate, a drain, and a source, wherein the gate is connected to the source, the source is connected to the gate and one of the pair of sensor terminals; and the drain is connected to another of the pair of sensor terminals,
   wherein, when in a first configuration of the multiplexer, the first plurality of interconnected switches, and the second plurality of interconnected switches, a gate of a first transistor of the bitcell and one of a drain and a source of the first transistor of the bitcell are coupled to the test voltage, another of the drain and the source of the first transistor of the bitcell is coupled to the drain of the zero-$V_{TH}$ thick-oxide NMOS transistor, and the gate and the source of the zero-$V_{TH}$ thick-oxide NMOS transistor are coupled to ground.

2. The circuit of claim 1, wherein when in a second configuration of the multiplexer, the first plurality of interconnected switches, and the second plurality of interconnected switches, a gate of a second transistor of the bitcell and one of a drain and a source of the second transistor of the bitcell are coupled to ground, another of the drain and the source of the second transistor of the bitcell is coupled to the gate and the source of the zero-$V_{TH}$ thick-oxide NMOS transistor, and the drain of the zero-$V_{TH}$ thick-oxide NMOS transistor is coupled to the test voltage.

3. The circuit of claim 2, further comprising a hardware processor that uses a measurement of a voltage at the sense voltage node ($V_{SEN}$) to estimate a threshold voltage of the second transistor.

4. The circuit of claim 1, further comprising a hardware processor that uses a measurement of a voltage at the sense voltage node ($V_{SEN}$) to estimate a threshold voltage of the first transistor.

5. The circuit of claim 1, wherein the bitcell includes six different transistors, and each of six different configurations of the multiplexer, the first plurality of interconnected switches, and the second plurality of interconnected switches results in a coupling of the zero-$V_{TH}$ thick-oxide NMOS transistor to a different one of the six different transistors of the bitcell.

6. The circuit of claim 5, further comprising a hardware processor that uses measurements of voltages at the sense voltage node ($V_{SEN}$) in each of the six different configurations to estimate data retention voltage (DRV) of the bitcell.

7. The circuit of claim 6, wherein the hardware process estimates DRV polarity based on a vector $X_1=(V_{PL}-V_{PR}, V_{NL}-V_{NR})$, where $V_{PL}$ is the value of $V_{SEN}$ when a transistor PL in the bitcell is a device under test, $V_{PR}$ is the value of $V_{SEN}$ when a transistor PR in the bitcell is a device under test, $V_{NL}$ is the value of $V_{SEN}$ when a transistor NL in the bitcell is a device under test, and $V_{NR}$ is the value of $V_{SEN}$ when transistor NR is the device under test.

8. The circuit of claim 6, wherein the hardware process estimates DRV magnitude based on a vector $X_2=(\max(V_{PL}, V_{PR}), \max(V_{NL}, V_{NR}), \max(V_{AL}, V_{AR}))$, where $V_{PL}$ is the value of $V_{SEN}$ when a transistor PL in the bitcell is a device under test, $V_{PR}$ is the value of $V_{SEN}$ when a transistor PR in the bitcell is a device under test, $V_{NL}$ is the value of $V_{SEN}$ when a transistor NL in the bitcell is a device under test, $V_{NR}$ is the value of $V_{SEN}$ when transistor NR is the device under test, $V_{PL}$ is the value of $V_{SEN}$ when a transistor PL is a device under test, and $V_{PR}$ is the value of $V_{SEN}$ when a transistor PR is a device under test.

9. The circuit of claim 5, further comprising a hardware processor that uses measurements of voltages at the sense voltage node ($V_{SEN}$) in each of the six different configurations to estimate read access time ($T_{ACC}$) of the bitcell.

10. The circuit of claim 9, wherein the hardware process estimates $T_{ACC}$ polarity based on a vector $X_3=(V_{PL}-V_{PR}, V_{NL}-V_{NR}, V_{AL}-V_{AR}, V_{OS})$, where $V_{PL}$ is the value of $V_{SEN}$ when a transistor PL in the bitcell is a device under test; $V_{PR}$ is the value of $V_{SEN}$ when a transistor PR in the bitcell is a device under test; $V_{NL}$ is the value of $V_{SEN}$ when a transistor NL in the bitcell is a device under test; $V_{NR}$ is the value of $V_{SEN}$ when a transistor NR in the bitcell is a device under test; $V_{AL}$ is the value of $V_{SEN}$ when a transistor AL in the bitcell is a device under test; $V_{AR}$ is the value of $V_{SEN}$ when a transistor AR in the bitcell is a device under test; and a $V_{OS}$ is a sense amplifier's input-referred offset voltage.

11. The circuit of claim 9, wherein the hardware process estimates $T_{ACC}$ magnitude based on a vector $X_4=(\max(V_{PL}, V_{PR}), \max(V_{NL}, V_{NR}), \max(V_{AL}, V_{AR}), \max(V_{OS}))$, where $V_{PL}$ is the value of $V_{SEN}$ when a transistor PL in the bitcell is a device under test, $V_{PR}$ is the value of $V_{SEN}$ when a transistor PR in the bitcell is a device under test; $V_{NL}$ is the value of $V_{SEN}$ when a transistor NL in the bitcell is a device under test; and $V_{NR}$ is the value of $V_{SEN}$ when a transistor NR in the bitcell is a device under test, $V_{AL}$ is the value of $V_{SEN}$ when a transistor AL in the bitcell is a device under test, $V_{AR}$ is the value of $V_{SEN}$ when a transistor AR in the bitcell is a device under test, $V_{OS}$ is a sense amplifier's input-referred offset voltage.

* * * * *